(12) United States Patent
Eibl (10) Patent No.: US 10,386,394 B2
(45) Date of Patent: Aug. 20, 2019

(54) RUN-TIME CONFIGURABLE GRAPHICAL INTERFACE FOR MEASURING DEVICE

(75) Inventor: Joachim Eibl, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 1431 days.

(21) Appl. No.: 12/397,156

(22) Filed: Mar. 3, 2009

(65) Prior Publication Data

US 2009/0222771 A1    Sep. 3, 2009

(30) Foreign Application Priority Data

Mar. 3, 2008  (DE) .................. 10 2008 012 306
Apr. 4, 2008  (DE) .................. 10 2008 017 289

(51) Int. Cl.
| | |
|---|---|
| *G01R 1/02* | (2006.01) |
| *G06F 8/34* | (2018.01) |
| *G01R 13/02* | (2006.01) |
| *G01R 19/25* | (2006.01) |
| *G01R 31/319* | (2006.01) |

(52) U.S. Cl.
CPC ......... *G01R 19/2516* (2013.01); *G01R 1/025* (2013.01); *G01R 13/029* (2013.01); *G01R 31/31912* (2013.01); *G06F 8/34* (2013.01)

(58) Field of Classification Search
CPC .......... G06F 8/34; G06F 8/38; G06F 2217/74; G05B 2219/23258; G05B 2219/25067; G05B 2219/33125; G01R 1/025; G01R 19/2516; G01R 13/029
USPC ......................................................... 715/811
See application file for complete search history.

(56) References Cited

U.S. PATENT DOCUMENTS

| | | | | | |
|---|---|---|---|---|---|
| 5,155,836 A | * | 10/1992 | Jordan | ............... | G01R 31/2834 |
| | | | | | 703/13 |
| 5,371,851 A | * | 12/1994 | Pieper | ............ | G01R 31/318307 |
| | | | | | 345/501 |
| 5,517,105 A | * | 5/1996 | Holzwarth | ............. | G01R 13/30 |
| | | | | | 324/121 R |
| 5,742,276 A | * | 4/1998 | Taraki | ..................... | F02P 17/08 |
| | | | | | 324/379 |
| 5,841,959 A | * | 11/1998 | Guiremand | .................... | 345/440 |
| 5,861,882 A | * | 1/1999 | Sprenger | ................ | G01R 1/025 |
| | | | | | 700/83 |

(Continued)

FOREIGN PATENT DOCUMENTS

DE    102 02 501 A1    7/2003
EP    1 359 426 A2    11/2003

*Primary Examiner* — Ajay M Bhatia
*Assistant Examiner* — Phoebe X Pan
(74) *Attorney, Agent, or Firm* — Ditthavong & Steiner, P. C.

(57) ABSTRACT

A measuring device providing a display device. The operation of the measuring device can be adapted by a user. In this context, operation includes the input and output of parameters in dialogs and the switching between dialogs. The display device displays the dialogs and can display several dialogs simultaneously. The input of given values in given dialogs effects the opening and/or closing of at least one respectively associated further dialog. The content and/or the position and/or the form and/or the linking of the dialogs are adapted. The operation of the measuring device is functional during the adaptation. Exclusively the currently-displayed dialogs are adaptable.

14 Claims, 7 Drawing Sheets

(56) References Cited

U.S. PATENT DOCUMENTS

| | | | | |
|---|---|---|---|---|
| 5,953,009 A * | 9/1999 | Alexander | | G01R 13/345 345/440 |
| 6,229,536 B1 * | 5/2001 | Alexander | | G01R 13/345 345/440 |
| 6,239,796 B1 * | 5/2001 | Alexander | | G06F 3/0481 715/781 |
| 6,320,577 B1 * | 11/2001 | Alexander | | G01R 13/02 345/440 |
| 6,327,544 B1 * | 12/2001 | Samuels | | G01R 31/31912 345/501 |
| 6,518,744 B1 * | 2/2003 | Tallman | | G01R 13/208 324/121 R |
| 6,522,345 B1 * | 2/2003 | Alexander | | G01R 13/345 345/440 |
| 6,525,525 B1 * | 2/2003 | Azinger | | G01R 13/345 324/121 R |
| 6,564,368 B1 * | 5/2003 | Beckett | | G06F 8/34 717/102 |
| 6,567,760 B1 * | 5/2003 | Kikuchi | | G01R 13/347 702/66 |
| 6,570,592 B1 * | 5/2003 | Sajdak | | G01R 13/02 345/440.1 |
| 6,639,607 B1 * | 10/2003 | Ferguson | | G06F 11/25 714/E11.155 |
| 6,690,398 B1 * | 2/2004 | Beck | | G01R 13/0254 702/57 |
| 6,697,754 B1 * | 2/2004 | Alexander | | G01R 13/22 702/119 |
| 6,707,474 B1 * | 3/2004 | Beck | | G01R 1/025 702/66 |
| 6,714,883 B1 | 3/2004 | Samuels | | |
| 6,937,237 B2 * | 8/2005 | McCarthy | | G06T 11/206 345/440 |
| 6,965,383 B2 * | 11/2005 | Ritter | | G01R 13/0227 345/173 |
| 7,013,430 B2 * | 3/2006 | Jaffe | | G01R 13/02 345/440.1 |
| 7,079,140 B2 * | 7/2006 | Boehler | | A61B 6/032 345/440 |
| 7,210,117 B2 * | 4/2007 | Kudukoli | | G06F 8/34 715/762 |
| 7,373,263 B2 * | 5/2008 | Cohn | | G01R 31/31708 324/500 |
| 7,403,560 B2 * | 7/2008 | Gamper | | G01R 13/0209 375/228 |
| 7,533,347 B2 * | 5/2009 | Santori | | G06F 8/34 715/762 |
| 7,624,375 B2 * | 11/2009 | Santori | | G06F 8/38 715/717 |
| 7,650,589 B2 * | 1/2010 | Cifra | | 717/105 |
| 7,725,874 B2 * | 5/2010 | Kornerup et al. | | 717/105 |
| 7,853,339 B2 * | 12/2010 | Miller | | G05B 23/021 700/28 |
| 7,929,461 B2 * | 4/2011 | Ramesh | | H04L 43/045 370/257 |
| 7,953,767 B2 * | 5/2011 | Shaburov | | 707/805 |
| 8,195,413 B2 * | 6/2012 | Freidhof | | G01R 13/345 324/76.11 |
| 8,201,077 B2 * | 6/2012 | Reddy | | G03G 15/5091 358/1.15 |
| 8,271,943 B2 * | 9/2012 | Hudson, III | | G06F 8/34 717/113 |
| 8,365,086 B2 * | 1/2013 | Grace | | G06F 8/38 715/771 |
| 8,387,002 B2 * | 2/2013 | Dellas | | G06F 8/34 717/106 |
| 8,676,357 B2 * | 3/2014 | Boercsoek | | G05B 19/4185 700/78 |
| 8,825,183 B2 * | 9/2014 | Hammack | | G05B 19/409 700/17 |
| 2001/0019338 A1 * | 9/2001 | Roth | | G06F 3/0482 715/811 |
| 2002/0055834 A1 * | 5/2002 | Andrade | | G06F 11/263 703/27 |
| 2002/0075267 A1 * | 6/2002 | Cake | | G01R 13/029 345/440 |
| 2002/0171682 A1 * | 11/2002 | Frank et al. | | 345/790 |
| 2003/0037322 A1 * | 2/2003 | Kodosky et al. | | 717/162 |
| 2003/0058280 A1 * | 3/2003 | Molinari | | G01R 13/345 715/771 |
| 2003/0107595 A1 * | 6/2003 | Ciolfi | | G06F 8/34 715/762 |
| 2004/0204886 A1 * | 10/2004 | Rieger | | G01R 1/025 702/104 |
| 2004/0246001 A1 | 12/2004 | Sontag et al. | | |
| 2004/0255269 A1 * | 12/2004 | Santori | | G06F 8/38 717/109 |
| 2005/0039162 A1 * | 2/2005 | Cifra | | 717/105 |
| 2005/0062461 A1 | 3/2005 | Srikrishna et al. | | |
| 2005/0066285 A1 * | 3/2005 | Santori et al. | | 715/763 |
| 2005/0228608 A1 * | 10/2005 | Wells | | G06F 8/38 702/127 |
| 2006/0053408 A1 * | 3/2006 | Kornerup et al. | | 717/109 |
| 2007/0132779 A1 * | 6/2007 | Gilbert et al. | | 345/619 |
| 2009/0125130 A1 * | 5/2009 | Eldridge et al. | | 700/87 |
| 2009/0132996 A1 * | 5/2009 | Eldridge et al. | | 717/108 |
| 2009/0210826 A1 * | 8/2009 | Sierer | | G06Q 20/10 715/853 |
| 2009/0327942 A1 * | 12/2009 | Eldridge et al. | | 715/771 |
| 2010/0222902 A1 * | 9/2010 | Eldridge et al. | | 700/87 |

\* cited by examiner

Fig. 7

RUN-TIME CONFIGURABLE GRAPHICAL INTERFACE FOR MEASURING DEVICE

CROSS-REFERENCE TO RELATED APPLICATION

The present application claims priority to German Patent Application No. 10 2008 012 306.4, filed on Mar. 3, 2008, and German Patent Application No. 10 2008 017 289.8, filed on Apr. 4, 2008, the entire contents of which are herein incorporated by reference.

BACKGROUND OF THE INVENTION

Field of the Invention

The invention relates to a measuring device with adaptable operation and a method for adapting the operation of a measuring device.

Discussion of the Background

In computer technology, dialog editors are widely available. Within very narrow limits, a retrospective modification of dialog functionalities of adaptable menu options, for example, in standard text-processing software, is known. However, in this context, only a selection from a few rigidly preset, placeable buttons is provided. The provision of a dialog structure is not possible.

The German Patent Application No. DE 102 02 501 A1 describes a dialog system, which can be adapted retrospectively. However, this dialog system is not related to a measuring device. Moreover, here also, adaptation is possible only separately from the use of the dialog system. In this context, the software must first be re-compiled after the adaptation, in order to be used again.

SUMMARY OF THE INVENTION

Embodiments of the present invention advantageously provide a method for adapting the operation of a measuring device and a measuring device, which can be adapted in its operation, which are characterized by great flexibility while guaranteeing a logical overview.

The measuring device according to the invention provides a display device. The operation of the measuring device can be adapted. In this context, the operation consists of the input and output of parameters in dialogs and the switching between dialogs. The display device displays the dialogs. The display device can display several dialogs simultaneously. The input of given values into given dialogs effects the opening and/or closing of at least one respectively associated further dialog. The content and/or the position and/or the form and/or the linking of the dialogs are adapted. The operation of the measuring device is functional during the adaptation. Exclusively the currently-displayed dialogs are adaptable. Accordingly, a simple, intuitive adaptation of the operation of the measuring device is guaranteed. As a result of the functionality of operation during the adaptation, different operating conditions can be included and adapted in a targeted manner.

The dialog is preferably a combination of input fields and/or output fields in an enclosed region of the display device. A dialog can preferably contain at least one further subordinate dialog. This guarantees a flexible design of the user surface and a simple and intuitive operation.

The display device preferably displays text and/or graphics by means of output fields. The user enters numerical values and/or texts and/or selects preferably preset entries preferably by means of input fields. Accordingly, a flexible operation and an adaptation of the measuring device and a high information content of the dialogs are provided.

The measuring device advantageously also provides a processing device and a databank. By preference, the processing device stores the parameters and dialogs in a databank. This guarantees the latest update status of the parameters and the dialogs during operation and adaptation.

Furthermore, the measuring device preferably provides a processing device. Upon the input of a parameter in a dialog, the processing device advantageously automatically updates the displayed dialogs and preferably automatically opens and/or closes associated dialogs. This guarantees simple operation, so that manual updating is not necessary.

The values of the parameters, which are entered in a dialog, are preferably available in all further dialogs, in which the parameters are displayed. Consistency of the parameters and accordingly a high level of accuracy in operation is therefore attainable.

The display device preferably displays several dialogs side-by-side and/or one above the other and/or superimposed. This guarantees a high information content of the display.

The display device preferably displays the dialogs with an adjustable degree of transparency. Accordingly, for example, graphics can be built up from several superimposed graphics components. This provides an increase in flexibility while reducing complexity.

BRIEF DESCRIPTION OF THE DRAWINGS

By way of example, the invention is described below with reference to drawings, which illustrate an advantageous exemplary embodiment of the invention. The drawings are as follows.

DETAILED DESCRIPTION OF EXEMPLARY EMBODIMENTS OF THE INVENTION

Initially, the functioning of dialogs according to embodiments of the invention and of the measuring device according to the invention will be explained with reference to FIGS. 1-4. Following this, the functioning of the adaptation of the dialogs will be explained with reference to FIGS. 5-7. Finally, the superimposition of graphics will be explained with reference to FIGS. 8 and 9. In some cases, the presentation and description of identical elements in similar illustrations has not been repeated.

Figure 1:
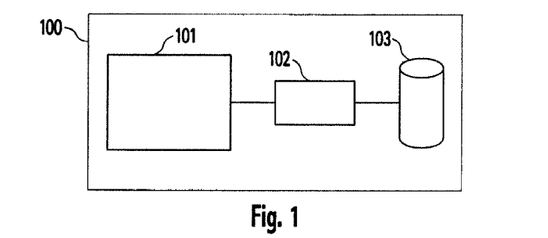
FIG. 1 shows a block-circuit diagram of an exemplary measuring device.

FIG. 1 illustrates an exemplary measuring device 100. The measuring device 100 provides a display device 101, a processing device 102 and a databank 103. In this context, the display device 101 and the processing device 102 are connected to one another. The processing device 102 determines what the display device 101 displays. The processing device 102 and the databank 103 are connected to one another in this context. The databank 103 stores system parameters and dialogs of the measuring device 100.

Figure 2:
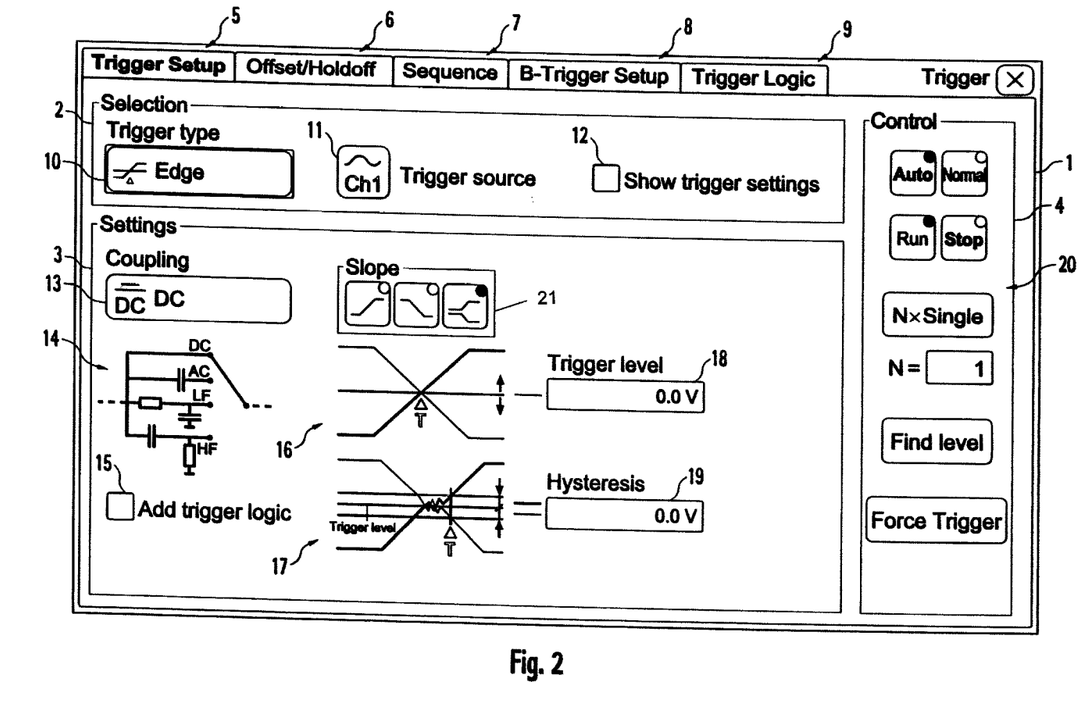
FIG. 2 shows a first dialog according to an embodiment of the invention.

FIG. 2 shows a first dialog according to an embodiment of the invention. The display device 101 shows a dialog 1 on an overall surface. The dialog 1 contains several input fields 5, 6, 7, 8, 9 in the form of tabs and several subordinate dialogs 2, 3, 4. In this context, the tabs are used for opening and/or closing dialogs 1, 2, 3, 4. When a tab 5 is selected, the displayed dialogs 1, 2, 3, 4 are opened. With the tabs 6, 7, 8, 9, the dialogs 1, 2, 3, 4 are closed and other dialogs are opened. However, these will not be described in greater detail here. The first subordinate dialog 2 contains three input fields 10, 11, 12 of different types. The input fields 10, 11 are drop-down menus. The input field 12 is a checkbox. If the input field 10 or 11 is selected, a list of selection options for the trigger type or the source of the trigger signal of the measuring device 100 is rolled down. This will be explained in greater detail with reference to FIG. 3. If the input field 12 is selected, it can be activated or deactivated in this manner. The deactivated status is illustrated. This input field controls the display of further subordinate dialogs.

The subordinate dialog 3 contains five input fields 13, 15, 18, 19 of different types and one subordinate dialog 14. The input field 13 is a drop-down menu like the input fields 10, 11. The signal type of the trigger signal can be selected via this input field. The input field 15 is checkbox like the input field 12. By activating this input field 15, an additional, subordinate dialog is opened, by means of which trigger logic can be added. The input fields 18, 19 are text input fields. In this context, the text is limited to numerical values. These numerical values can additionally be restricted to given numerical ranges. In this case, the levels, for example, voltages, of the trigger levels and the hysteresis are entered.

The input field 21 consists of three selection buttons. By selecting one of the buttons, the corresponding slope of the trigger signal is selected. The output fields 16, 17 are used to explain the function of the associated input fields 18, 19. The subordinate dialog 14 displays the selected signal type for the trigger signal in a graphic output field. Dependent upon the selected setting of the input field 13, a different graphic is displayed here.

The subordinate dialog 4 provides further input fields 20 for controlling the measuring device. The respective function will not be described in greater detail here.

In this context, the individual dialogs and their form are stored in a databank 103. System parameters, such as the trigger type just selected, are stored there. If a system parameter is modified, the modification is stored in the databank 103.

Figure 3:
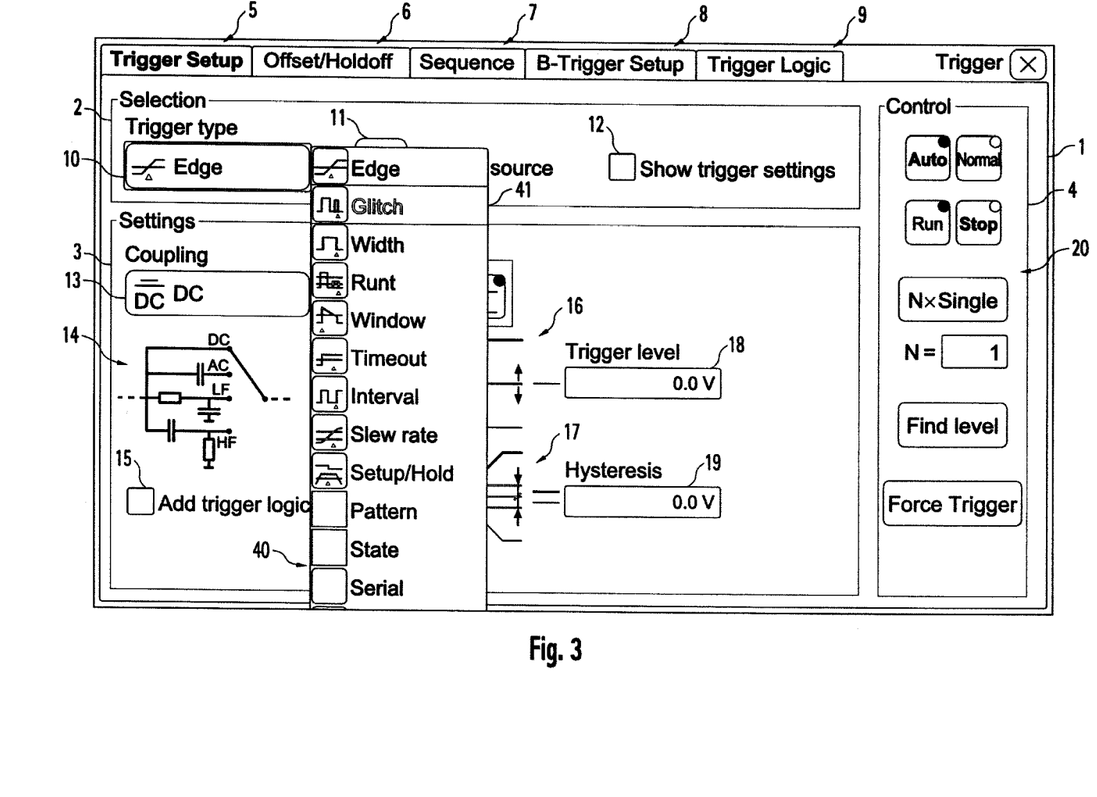
FIG. 3 shows a second dialog according to an embodiment of the invention.

FIG. 3 shows a second dialog according to an embodiment of the invention. The dialog 1 shown here corresponds to the dialog 1 presented in FIG. 2 after the selection of the input field 10. This selection leads to the rolling down of selection list 40 with preset options. The option 41 "glitch" is currently selected. By confirming this selection, the trigger type is set to the glitch trigger and a corresponding modification of the dialogs displayed is implemented. This will be described in greater detail with reference to FIG. 4. Selecting the option 41 "glitch" also effects an amendment of an associated parameter. This change is stored in a databank 103 and is available with immediate effect to all dialogs, which require this parameter. If currently-displayed dialog elements are affected by the modification, these are also updated.

Figure 4:
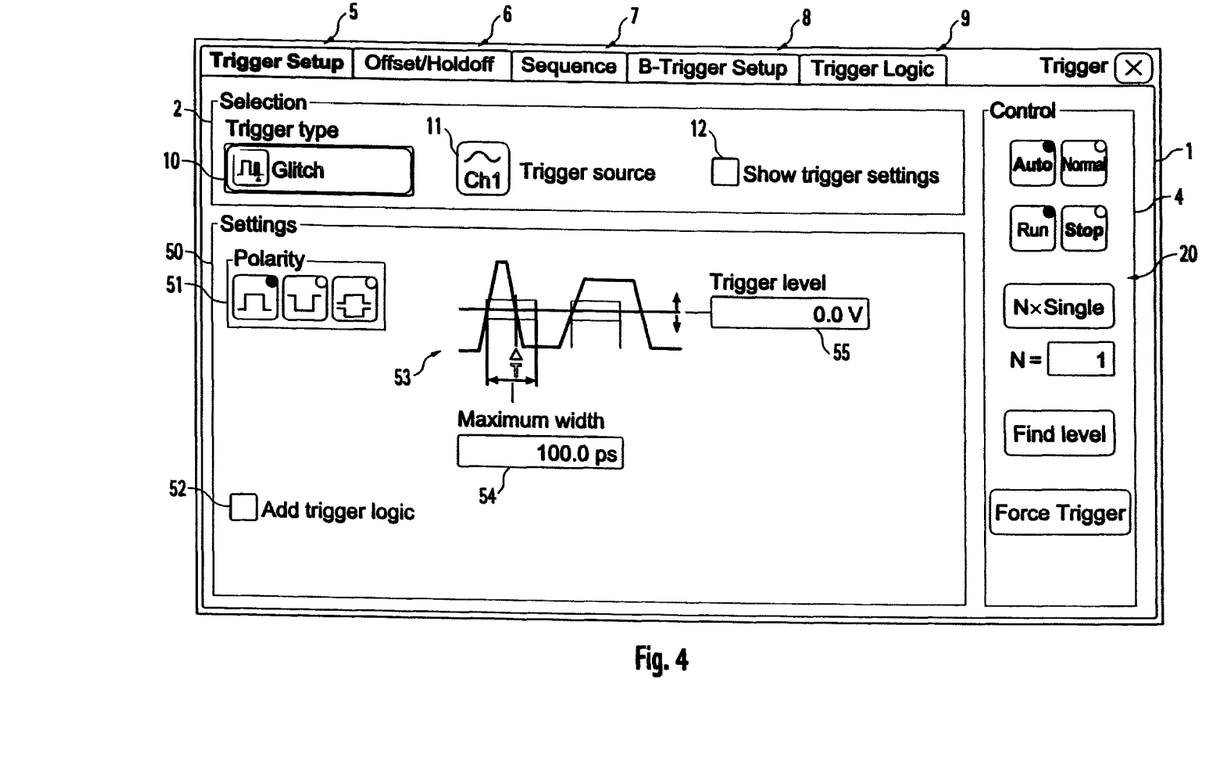
FIG. 4 shows a third dialog according to an embodiment of the invention.

FIG. 4 shows a third dialog according to an embodiment of the invention. The dialog 1 presented here corresponds to the dialog 1 shown in FIG. 2 after the selection of the input field 10 and after confirmation of the selection of the option 41 "glitch". In the databank, a given dialog configuration is stored for the selection "glitch". This dialog configuration is loaded and, as a result, given dialogs are opened or closed. The subordinate dialog 3 from FIG. 2 is now closed. Instead, the subordinate dialog 50 is opened. The subordinate dialog 50 is associated with the option 41 "glitch" from the selection list 40, while the previously-displayed subordinate dialog 3 from FIG. 2 was associated with the option "edge" of the selection list 40.

The subordinate dialog 50 contains four input fields 51, 52, 54, 55 and a subordinate dialog 53. In this context, the input field 51, like the input field 21 from FIG. 2, also consists of three selection buttons, which set the polarity of the trigger signal. The input field 52 corresponds to the input field 15 from FIG. 2 and FIG. 3. The input field 54 is used for the input of the maximum time "glitch" width in picoseconds. This is a text input field. The input field 55 corresponds to the input field 18 from FIG. 2 and FIG. 3.

The subordinate dialog 53 contains only one graphic element, which explains the meaning of the input fields 54 and 55. Alternatively, two superimposed subordinate dialogs 53, which are displayed in a partially transparent manner and each contain part of the graphic element, are displayed at this position of the subordinate dialog 50. Detailed reference to this alternative is provided in the context of FIG. 8 and FIG. 9.

Figure 5:
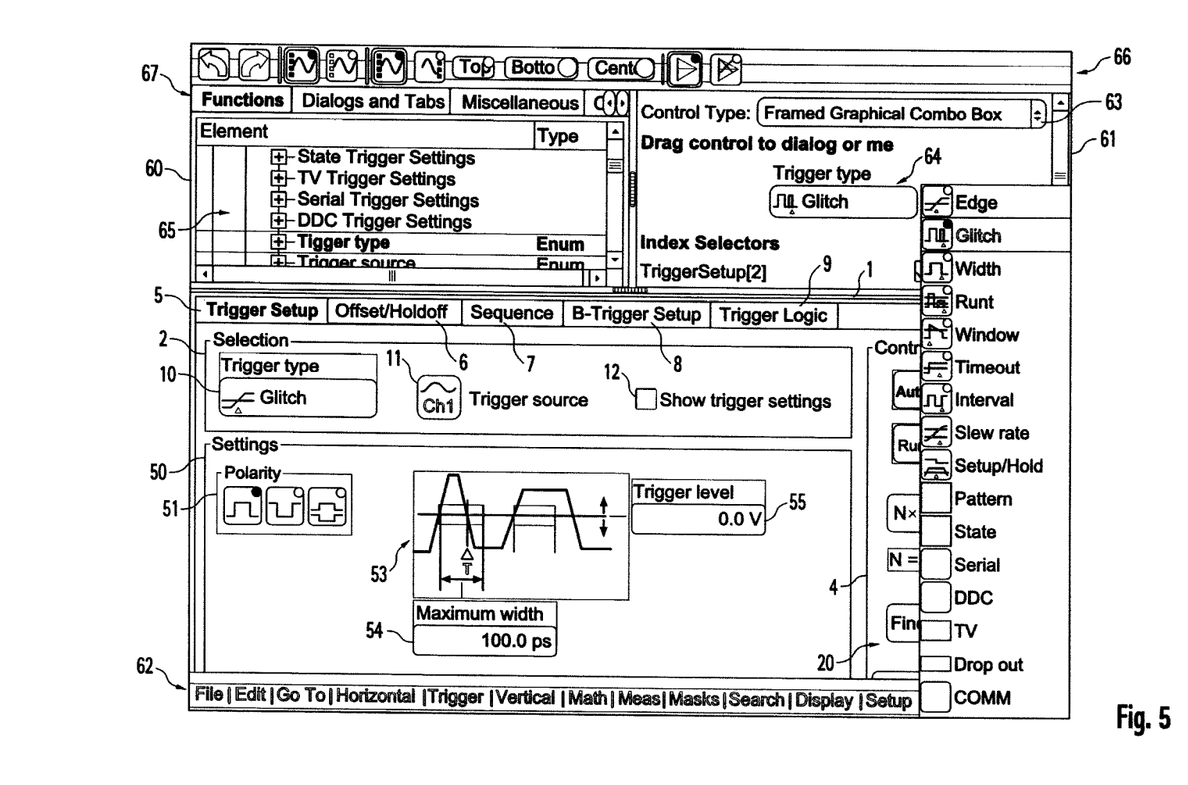
FIG. 5 shows a fourth dialog according to an embodiment of the invention with dialog editor open.

FIG. 5 presents a fourth dialog according to an embodiment of the invention with the dialog editor open. This display corresponds to the dialog from FIG. 4 after activation of the dialog editor. By means of the dialog editor, the contents and links of the dialogs are modified. Furthermore, new dialogs are prepared and dialogs, which are no longer needed, are removed. Changes to dialogs or additions and removals of dialogs are stored in a databank 103 and are always immediately available. An adaptation of the dialogs is possible only with the dialog editor open. The dialog editor provides two menu bars 62 and 66, in which various commands for the modification of the dialogs are placed.

In a selection menu 60, it is possible to choose, for example, input fields and output fields and further dialogs from a list 65 of possible dialog elements stored in the databank 103. The list 65 is sorted according to categories via the buttons 67. Settings for the respective element can be determined in a configuration menu 61. For example, the display type of the trigger-type selection is determined via a drop-down menu 63. The currently-selected element and its display, in the present context, the trigger type in a further drop-down menu 64, are displayed directly at this position in a preview display. Following this, the respective element is positioned in the corresponding dialog.

During positioning, the final view of the element is already displayed at the respective position. In this context, only the directly-activated dialog can be modified in each case. The active dialog can be set by selecting the respective dialog from the dialogs displayed. It is not possible to modify dialogs, which are not displayed. In order to adapt dialogs, which are not displayed, it is necessary first to display them. Since the functionality of the dialogs is also provided in any case with the dialog editor open, the dialogs displayed can simply be switched. This is particularly advantageous, because it guarantees considerable intuitiveness in the adaptation. Adaptations always relate to currently-set dialogs. Accidental adaptation of the incorrect dialog is therefore prevented. Accordingly, the amendment of system parameters, such as the trigger type from "edge" to "glitch", automatically leads to the display of the setting dialog for the "glitch" trigger, as illustrated in FIGS. 2-4. The functionality of the dialogs does in fact continue to be available with the dialog editor open, but the operation is changed. For example, with the dialog editor closed, clicking on a button will effect its activation. With the dialog editor open, selecting a button will effect a selection, for example, to delete it or to change it. A double-click or selection via a right click and a context menu, by contrast, implements the conventional action.

Figure 6:
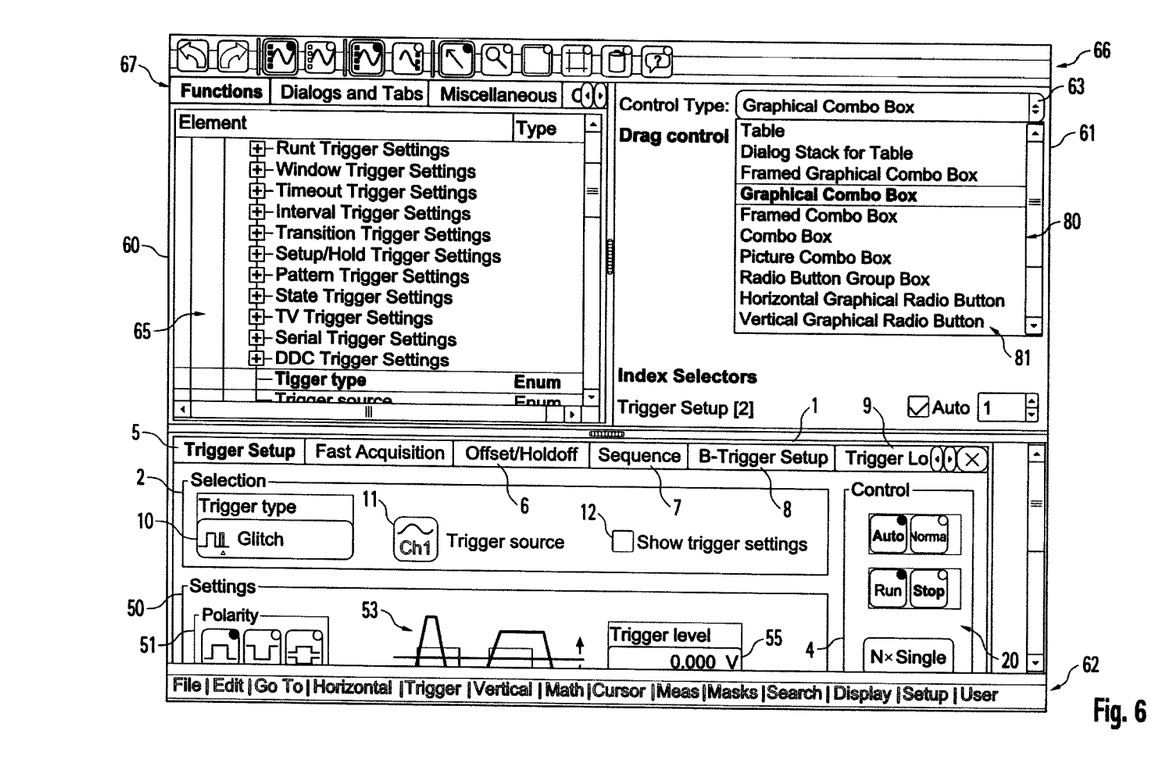
FIG. 6 shows a fourth dialog according to an embodiment of the invention with dialog editor open.

FIG. 6 shows a fifth dialog according to an embodiment of the invention with dialog editor open. The dialog illustrated here corresponds to the dialog shown in FIG. 5 after the selection of the drop-down menu 63. The drop-down menu 63 is rolled down here after selection. A list of possible display types 80 of the trigger selection is now displayed. In the subsequent FIG. 7, the sequence for the selection of the display type 81 "Vertical Graphical Radio Button" is shown. In view of the length of the list in the drop-down menu 63, the configuration menu 61 and the selection menu 60 are displayed vertically extended by comparison with the illustration in FIG. 5.

Figure 7:
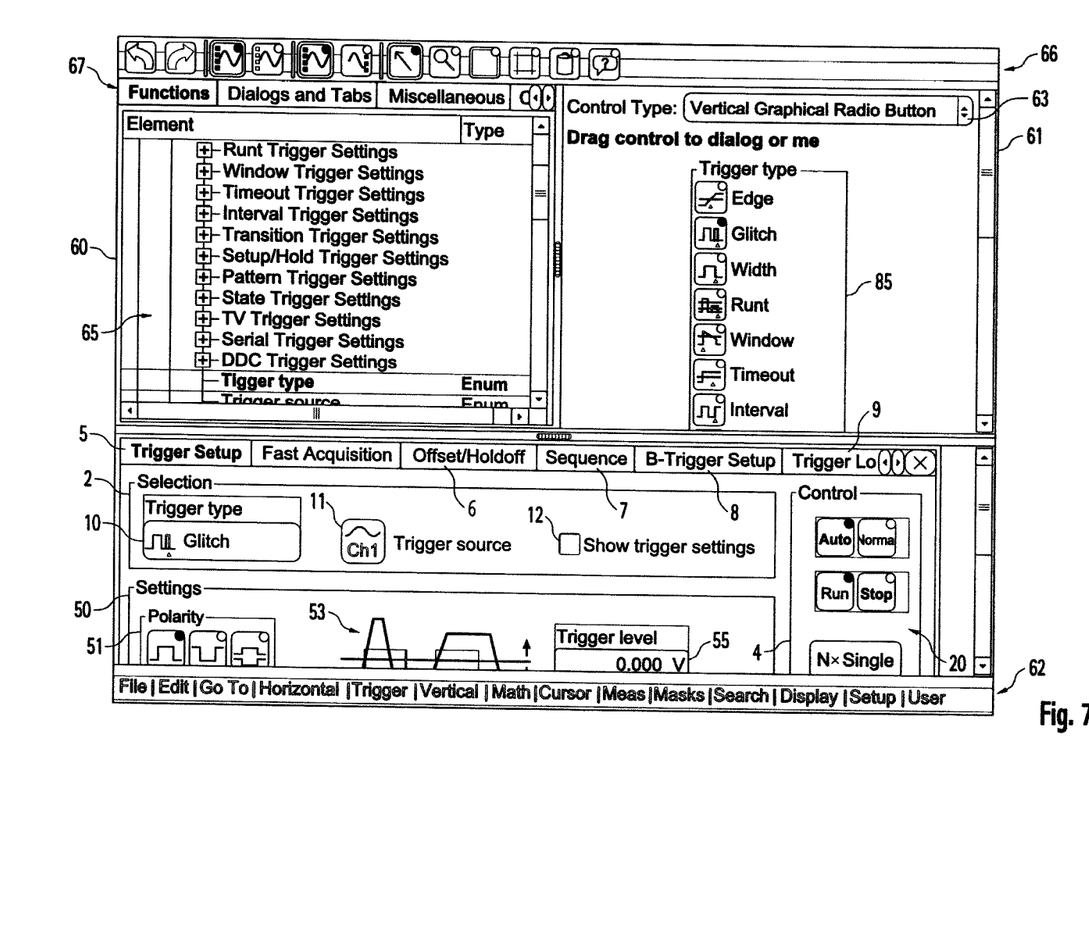
FIG. 7 shows a fifth dialog according to an embodiment of the invention with dialog editor open.

FIG. 7 shows a sixth dialog according to an embodiment of the invention with dialog editor open. The dialog illustrated here corresponds to the dialog shown in FIG. 6 after the selection of the display type 81 "Vertical Graphical Radio Button" from the list of the drop-down menu 63. Accordingly, in the configuration menu 61, a preview of the now selected element is displayed in the form of a radio button selection 85. The element can now be positioned at any required position of any required dialog.

Figure 8:
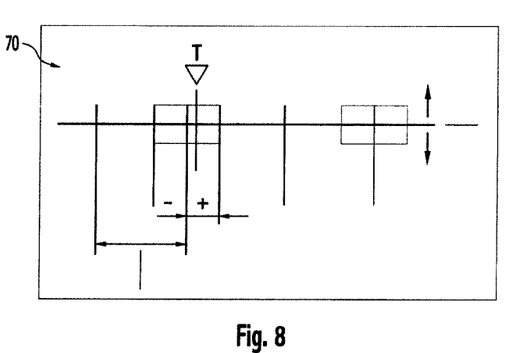
FIG. 8 shows a first exemplary graphic element.
Figure 9:
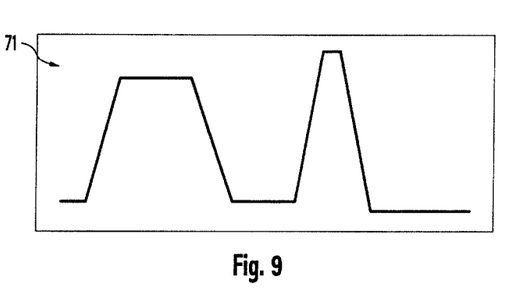
FIG. 9 shows a second exemplary graphic element.

FIGS. 8 and 9 show the graphic elements 70 and 71. The background of each of these graphic elements is transparent. The graphic elements 70 and 71 are each displayed in their own subordinate dialog. These subordinate dialogs are presented superimposed. In this manner, complex graphics can be built up from several graphic elements. On one hand, this reduces the complexity of the individual graphic elements. On the other hand, graphic elements can be used for several graphics to be displayed. This reduces the memory requirement and increases flexibility.

The invention is not restricted to the exemplary embodiment presented. As already mentioned, the invention can be realised by means of different measuring devices, such as oscilloscopes or network analysers. An expansion of the adjustable dialog options beyond those shown here is also conceivable. All of the features described above or illustrated in the drawings can be combined with one another as required within the framework of the invention.

The invention claimed is:

1. A method for configuring an operation of a measuring device that has a display device, the method comprising:
displaying dialogs for a measuring operation in a graphical user interface by the display device,
wherein the displayed dialogs of the measuring operation includes input and output of parameters in dialogs, switching between dialogs, and displaying several dialogs simultaneously;
wherein a dialog contains at least one further subdivided dialog forming a dialog structure, and several dialogs are displayed superimposed and partially transparent;
upon a first user input of given values in the displayed dialogs, at least one respectively associated further dialog is opened, closed, or combination thereof,
during the measuring operation, while the measuring operation of the measuring device is functional, retrospectively modified the displayed dialogs:
upon a second user input of activation of a dialog editor, display the dialog editor and the dialogs for the measuring operation simultaneously on the display;
upon a third user input selecting a dialog element from the currently displayed dialogs via a selection menu of possible dialog elements sorted according to categories, display a selection menu of control types for the selected dialog element;
upon a fourth user input selecting a control type for the selected dialog element from the selection menu of control types, display a preview of the selected control type for the selected dialog element;
upon a fifth user input positioning the selected control type for the selected dialog element in the currently displayed dialogs, replace the selected dialog element in the existing displayed dialogs with the selected control type for the selected dialog element;
upon additional user inputs, changing a content, a position, a form, a linking, or combination thereof, of the displayed dialogs using the dialog editor, wherein new dialogs are prepared and dialogs that are no longer needed are removed; and
applying changes to the displayed dialogs, and storing the changed dialogs in a databank;
wherein the measuring device is an oscilloscope or a network analyzer.

2. The method according to claim 1, wherein
text, graphics, or combination thereof, can be displayed using output fields, and
numerical values, texts, or combination thereof, can be input or preset entries can be selected by means of input fields.

3. The method according to claim 1, wherein
the parameters are stored in the databank.

4. The method according to claim 1, wherein,
upon the input of a parameter in a dialog, the displayed dialogs are automatically updated, and associated dialogs are automatically opened, closed, or combination thereof.

5. The method according to claim 1, wherein
values of the parameters, which are input in a dialog are available in all further dialogs, in which the parameters are displayed.

6. The method according to claim 1, wherein
several dialogs are displayed on the graphical user interface device side-by-side, one above the other, or combination thereof.

7. The method according to claim 1, wherein
the dialogs are presented with an adjustable degree of transparency.

8. A measuring device comprising:
a display device; and
a processing device configured to configure a measuring operation of the measuring device, the processing device comprises a memory storing instructions executable to perform:
displaying dialogs for the measuring operation in a graphical user interface by the display device;
wherein the displayed dialogs of the measuring operation includes input and output of parameters in dialogs, switching between dialogs, and displaying several dialogs simultaneously;

wherein a dialog contains at least one further subdivided dialog forming a dialog structure, and several dialogs are displayed superimposed and partially transparent;

upon a first user input of given values into the displayed dialogs, at least one respectively associated further dialog is opened, closed, or combination thereof, during the measuring operation, while the measuring operation of the measuring device is functional, retrospectively modified the displayed dialogs:

upon a second user input of activation of a dialog editor, display the dialog editor and the dialogs for the measuring operation simultaneously on the display;

upon a third user input selecting a dialog element from the currently displayed dialogs via a selection menu of possible dialog elements sorted according to categories, display a selection menu of control types for the selected dialog element;

upon a fourth user input selecting a control type for the selected dialog element from the selection menu of control types, display a preview of the selected control type for the selected dialog element;

upon a fifth user input positioning the selected control type for the selected dialog element in the currently displayed dialogs, replace the selected dialog element in the existing displayed dialogs with the selected control type for the selected dialog element;

upon additional user inputs, changing a content, a position, a form, a linking, or combination thereof, of the displayed dialogs via the dialog editor, wherein new dialogs are prepared and dialogs that are no longer needed are removed;

applying changes to the displayed dialogs, and storing the changed dialogs in a databank;

wherein the measuring device is an oscilloscope or a network analyzer.

9. The measuring device according to claim 8, wherein the graphical user interface displays text, graphics, or combination thereof, by means of output fields, and numerical values, texts, or combination thereof, can be input or preset entries can be selected using input fields.

10. The measuring device according to claim 8, wherein the processing device stores parameters in the databank.

11. The measuring device according to claim 8, wherein, upon the input of a parameter in a dialog, the processing device automatically updates the displayed dialogs and automatically opens, closes, or combination thereof, associated dialogs.

12. The measuring device according to claim 8, wherein the values of the parameters, which are entered in a dialog, are available in all further dialogs, in which the parameters are displayed.

13. The measuring device according to claim 8, wherein the graphical user interface displays several dialogs side-by-side, one above the other, or combination thereof.

14. The measuring device according to claim 8, wherein the graphical user interface displays the dialogs with an adjustable degree of transparency.

\* \* \* \* \*